(12) United States Patent
Lam

(10) Patent No.: US 9,723,727 B2
(45) Date of Patent: Aug. 1, 2017

(54) MODULAR ELECTRONIC INSTRUMENTATION CHASSIS WITH INTEGRATED HIGH PERFORMANCE REFERENCE CLOCK AND ASSOCIATED METHODS

(71) Applicant: Keysight Technologies, Inc., Minneapolis, MN (US)

(72) Inventor: Kuen Yew Lam, Selangor (MY)

(73) Assignee: Keysight Technologies, Inc., Santa Rosa, CA (US)

( * ) Notice: Subject to any disclaimer, the term of this patent is extended or adjusted under 35 U.S.C. 154(b) by 100 days.

(21) Appl. No.: 14/615,143

(22) Filed: Feb. 5, 2015

(65) Prior Publication Data

US 2016/0234978 A1 Aug. 11, 2016

(51) Int. Cl.
*H05K 3/46* (2006.01)
*G01R 1/04* (2006.01)

(52) U.S. Cl.
CPC ........ *H05K 3/46* (2013.01); *G01R 1/04* (2013.01)

(58) Field of Classification Search
CPC ............. H05K 3/46; H05K 3/301; G06F 1/18
USPC ................ 361/730, 752, 796, 807, 809, 810
See application file for complete search history.

(56) References Cited

U.S. PATENT DOCUMENTS 7,242,590 B1* 7/2007 Yeap .................. G01R 31/2834
174/384

9,295,169 B1* 3/2016 Spinner ............. G01R 31/2834
2010/0109786 A1* 5/2010 Maeda .................. H03L 7/0995
331/25

(Continued)

FOREIGN PATENT DOCUMENTS

CN 202600591 U 12/2012
CN 203376745 U 1/2014

OTHER PUBLICATIONS

Office Action dated Jun. 2, 2016 in Chinese Application No. 201620106832.6 (Unofficial/non-certified translation provided by foreign agent included).

(Continued)

*Primary Examiner* — Tuan T Dinh
*Assistant Examiner* — Rockshana Chowdhury

(57) ABSTRACT

The modular electronic instrumentation platform chassis is for use with a plurality of instrumentation modules and includes a frame defining a module area and a non-module area. The module area includes a plurality of slots open to a front of the frame and configured to receive instrumentation modules therein. A front panel may be carried by the front of the frame adjacent the plurality of slots. A chassis power unit is configured to provide power to the plurality of instrumentation modules received in the slots. A reference clock unit carried by the frame in the non-module area and is configured to provide a low phase-noise reference clock for the plurality of instrumentation modules received in the slots. The reference clock unit includes vibration dampening mounts that mount the reference clock unit to the frame, power supply circuitry, reference clock circuitry, a shield to isolate the power supply circuitry from the reference clock circuitry, and a plurality of reference clock outputs mounted in the front panel and coupled to the reference clock circuitry.

15 Claims, 4 Drawing Sheets

(56) References Cited

U.S. PATENT DOCUMENTS

2012/0113603 A1* 5/2012 Tokunaga ............. H05K 7/142
361/752
2013/0050171 A1* 2/2013 Tsai .................... G09G 3/3648
345/212

OTHER PUBLICATIONS

"NI PXI Timing and Synchronization Design Advantages", National Instruments, Jan. 20, 2015.

* cited by examiner

MODULAR ELECTRONIC INSTRUMENTATION CHASSIS WITH INTEGRATED HIGH PERFORMANCE REFERENCE CLOCK AND ASSOCIATED METHODS

BACKGROUND

Peripheral Component Interconnect (PCI) is a local computer bus for attaching hardware devices in a computer and is part of the PCI Local Bus standard. The PCI bus supports the functions found on a processor bus but in a standardized format that is independent of any particular processor's native bus. PCI eXtensions for Instrumentation (PXI) is one of several modular electronic instrumentation platforms in current use. Other platforms include PXI Express, Compact-PCI, and CompactPCI Express, for example. These platforms are used as a basis for building electronic test equipment, automation systems, modular laboratory instruments in science, and the like. PXI is based on industry-standard computer buses and permits flexibility in building equipment. Often modules are fitted with custom software to manage the system.

PXI is designed for measurement and automation applications that need high-performance and a rugged industrial form-factor. With PXI, modules can be selected from various vendors and be integrated into a single PXI system. A full width PXI chassis may contain up to 18 PXI slots.

PXI uses PCI-based technology and an industry standard governed by the PXI Systems Alliance (PXISA) to ensure standards compliance and system interoperability. There are PXI modules available for almost every test, measurement, and automation application, from the switching modules to high-performance microwave vector signal generation and analysis. PXI is based on CompactPCI. PXI adds a rugged CompactPCI mechanical form-factor, an industry consortium that defines hardware, electrical, software, power and cooling requirements. Then PXI adds integrated timing and synchronization that is used to route synchronization clocks, and triggers internally.

Most PXI instrument modules are register-based products, which use software drivers hosted on a PC to configure them as useful instruments, using the power of PCs to improve hardware access and simplify embedded software in the modules. The open architecture allows hardware to be reconfigured to provide new facilities and features that are difficult to emulate in comparable bench instruments.

PXI modules providing the instrument functions are plugged into a PXI chassis which may include its own controller running an industry standard operating system such as Windows XP, Windows 2000, or Linux (which is not yet PXI System Alliance approved), or a PCI-to-PXI bridge that provides a high-speed link to a desktop PC controller. Likewise, multiple PXI racks can be linked together with PCI bridge cards, to build very large systems such as multiple source microwave signal generator test stands for complex ATE applications.

PXI Express (PXIe) is an adaptation of PCI Express to the PXI form factor. PXI Express also allows for the use of hybrid slots, compatible with both PXI and PXIe modules.

Test and measurement instrumentation has been moving from traditional box instruments to a more modular format like PXIe, which provides several advantages to product designers and customers, for example a smaller footprint, more flexible configuration, and ease of upgrade. While traditional box instruments have always been thought to provide higher measurement performance that modular instruments simply cannot provide, this notion has changed with recent advancements in technologies which have enabled designers to implement high performance systems in the modular format like PXIe and AXIe, for example Keysight's family of VSAs (Vector Signal Analyzer) and VSGs (Vector Signal generator) (e.g. M9393A, M9381A).

Due to the limited PCB space available on a PXIe module, the high performance RF instruments are typically broken up into separate functional blocks which are implemented on multiple modules. For example, the Keysight M9393A VSA instrument includes four modules, a reference clock, synthesizer, downconverter, and an IF digitizer module. A VSA or VSG instrument within a chassis needs a reference clock module, for example, to generate a low phase noise 100 MHz reference clock for all instruments in the chassis. This reference clock is connected to the instrument modules using coaxial cables, such as SMA (SubMiniature version A) cables. A drawback of this approach is the need for the reference clock module which takes up a slot in the chassis.

The PXIe chassis natively provides a 100 MHz reference clock to all slots via the backplane. However, the quality of this clock may not be high enough for high performance RF applications like the VSA. Being a modular instrument, where these modules can be installed in a PXIe chassis from any vendor, there is currently no way to guarantee that the native PXIe chassis reference clock is good enough for the instrument.

In view of various shortcomings of conventional approaches, there may be a general need for a modular electronic instrumentation platform chassis with an isolated reference clock unit, that does not take up a slot in the chassis, and that provides a clean reference clock for all instruments in the chassis.

SUMMARY

In accordance with a representative embodiment, a modular electronic instrumentation platform chassis is provided with a dedicated reference clock unit that does not take up a slot in the chassis, and that provides a quality reference clock for instrument modules in the chassis.

The modular electronic instrumentation platform chassis is for use with a plurality of instrumentation modules and includes a frame defining a module area and a non-module area. The module area includes a plurality of slots open to a front of the frame and configured to receive instrumentation modules therein. A front panel may be carried by the front of the frame adjacent the plurality of slots. A chassis power unit is configured to provide power to the plurality of instrumentation modules received in the slots. A reference clock unit carried by the frame in the non-module area and is configured to provide a low phase-noise reference clock for the plurality of instrumentation modules received in the slots. The reference clock unit includes vibration dampening mounts that mount the reference clock unit to the frame, power supply circuitry, reference clock circuitry, a shield to isolate the power supply circuitry from the reference clock circuitry, and a plurality of reference clock outputs mounted in the front panel and coupled to the reference clock circuitry.

In an embodiment, the reference clock unit may further include a plurality of printed circuit board (PCB) layers including at least a first PCB layer including the power supply circuitry, and at least a second PCB layer including the reference clock circuitry. The shield may be a metal layer between the first and second PCB layers, and/or the shield may enclose each of the plurality of PCBs.

In an embodiment, the plurality of reference clock outputs may be cable connectors. Also, cables may respectively connect the reference clock circuitry to each of the cable connectors of the plurality of reference clock outputs.

In an embodiment, the vibration dampening mounts may be rubber mounts. Also, the reference clock unit may be electrically isolated from the chassis power unit.

In another representative embodiment, a modular electronic instrumentation platform chassis includes a frame defining a module area and a non-module area, the module area including a plurality of slots and configured to receive instrumentation modules therein. A chassis power unit is configured to provide power to the plurality of instrumentation modules received in the slots. A reference clock unit is carried by the frame in the non-module area, is electrically isolated from the chassis power unit, and is configured to provide a reference clock for the plurality of instrumentation modules received in the slots. The reference clock unit includes vibration dampening mounts that mount the reference clock unit to the frame, power supply circuitry, reference clock circuitry, a shield to isolate the power supply circuitry from the reference clock circuitry, and a plurality of reference clock outputs coupled to the reference clock circuitry.

In another representative embodiment, a method of making a modular electronic instrumentation platform chassis for use with a plurality of instrumentation modules, and includes providing a frame defining a module area and a non-module area. The module area includes a plurality of slots open to a front of the frame and is configured to receive instrumentation modules therein. The method includes providing a front panel on the front of the frame adjacent the plurality of slots, installing a chassis power unit configured to provide power to the plurality of instrumentation modules received in the slots, and installing a reference clock unit in the non-module area of the frame with vibration dampening mounts and configured to provide a low phase-noise reference clock for the plurality of instrumentation modules received in the slots. The reference clock unit includes power supply circuitry, reference clock circuitry, a shield to isolate the power supply circuitry from the reference clock circuitry, and a plurality of reference clock outputs mounted in the front panel and coupled to the reference clock circuitry.

The method may include respectively connecting the reference clock circuitry to each of the cable connectors of the plurality of reference clock outputs with cables. Also, the method may include electrically isolating the reference clock unit from the chassis power unit.

The present embodiments integrate a high performance reference clock unit into a modular electronic instrumentation platform chassis (e.g. a PXIe chassis). The features of the present embodiments may provide advantages over existing approaches including: no longer being limited by form factor as the reference clock unit can be as large as required, as long as it can fit within the chassis; not requiring, a module slot for the reference clock unit, thus freeing up valuable slot resources to be used for other instruments; providing vibration isolation to alleviate microphonic effects on the clocks due to vibration from fans and other external vibration sources; and the use of a separate power supply to provide electrical isolation from other noise sources within the chassis and modules, thus improving sensitivity to noise and increasing phase noise performance.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DESCRIPTION

Figure 1:
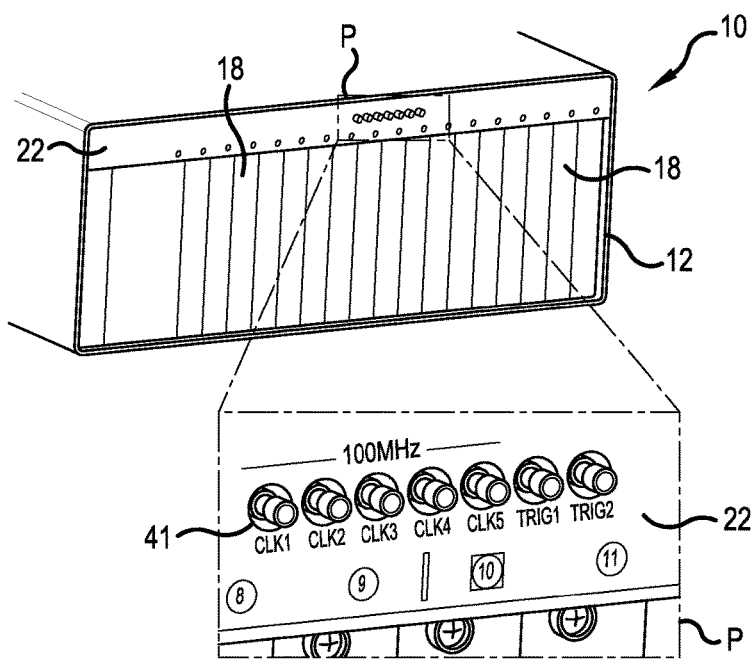
FIG. 1 is a perspective view of an embodiment of a modular electronic instrumentation platform chassis with a dedicated reference clock unit in accordance with features of the present invention.
Figure 2:
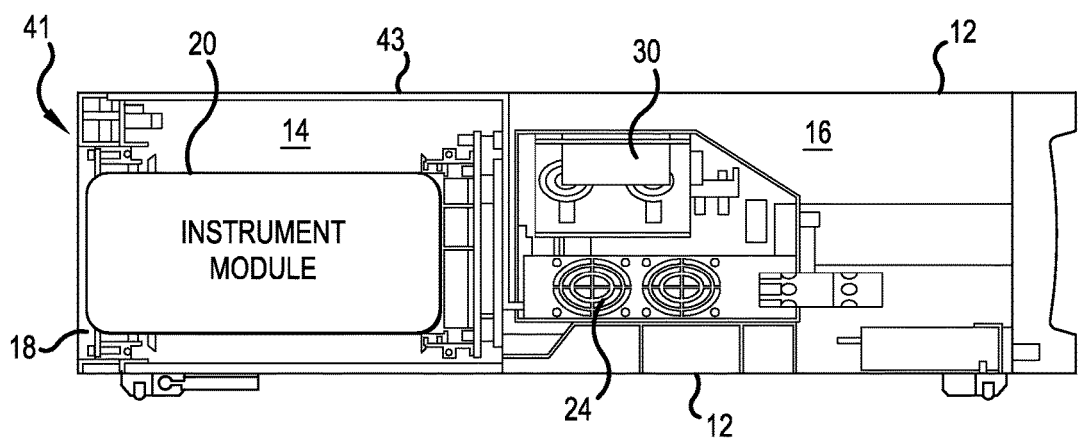
FIG. 2 is a side view of an example of the interior of the modular electronic instrumentation platform chassis, including module area and non-module area, and dedicated reference clock unit of the embodiment of FIG. 1.
Figure 3:
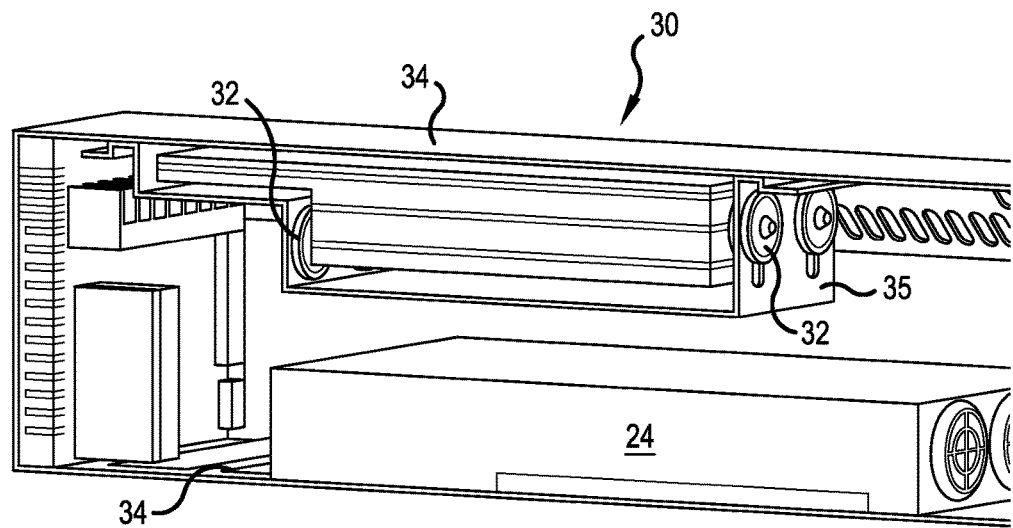
FIG. 3 is a perspective view of an example of the non-module area of the modular electronic instrumentation platform chassis and dedicated reference clock unit of the embodiment of FIGS. 1 and 2.

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices. As used in the specification and appended claims, and in addition to their ordinary meanings, the terms 'substantial' or 'substantially' mean to within acceptable limits or degree. As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Similarly, if the device were rotated by 90° with respect to the view in the drawings, an element described "above" or "below" another element would now be "adjacent" to the other element; where "adjacent" means either abutting the other element, or having one or more layers, materials, structures, etc., between the elements.

Referring initially to FIGS. 1-5, a representative embodiment of a modular electronic instrumentation platform chassis 10 will be described. The modular electronic instrumentation platform chassis 10 is provided with a dedicated and/or electrically isolated reference clock unit 30 that does not take up a slot 18 in the chassis 10, and that provides a quality reference clock (e.g. ultra-low phase noise) for instrument modules 20 in the chassis 10.

The modular electronic instrumentation platform chassis 10 is for use with a plurality of instrumentation modules 20 and includes a frame 12 defining a module area 14 and a non-module area 16. The module area includes a plurality of slots 18 open to a front of the frame 12 and configured to receive instrumentation modules 20 therein. A front panel 22 may be carried by the front of the frame 12 adjacent the plurality of slots 18. A chassis power unit 24 is configured to provide power to the plurality of instrumentation modules 20 received in the slots 18.

The reference clock unit 30 is carried by the frame 12 in the non-module area 16 and is configured to provide a low phase-noise reference clock for the plurality of instrumentation modules 20 received in the slots 18. The reference clock unit 30 includes vibration dampening mounts 32 that mount the reference clock unit 30 to the frame 12, for example via a removable tray 34 and component bracket 35. In an embodiment, the vibration dampening mounts 32 may be rubber mounts, for example, which are designed to mechanically isolate the reference clock unit 30 from the chassis 10 to reduce the effects of mechanical vibration on the clock performance.

Figure 4:
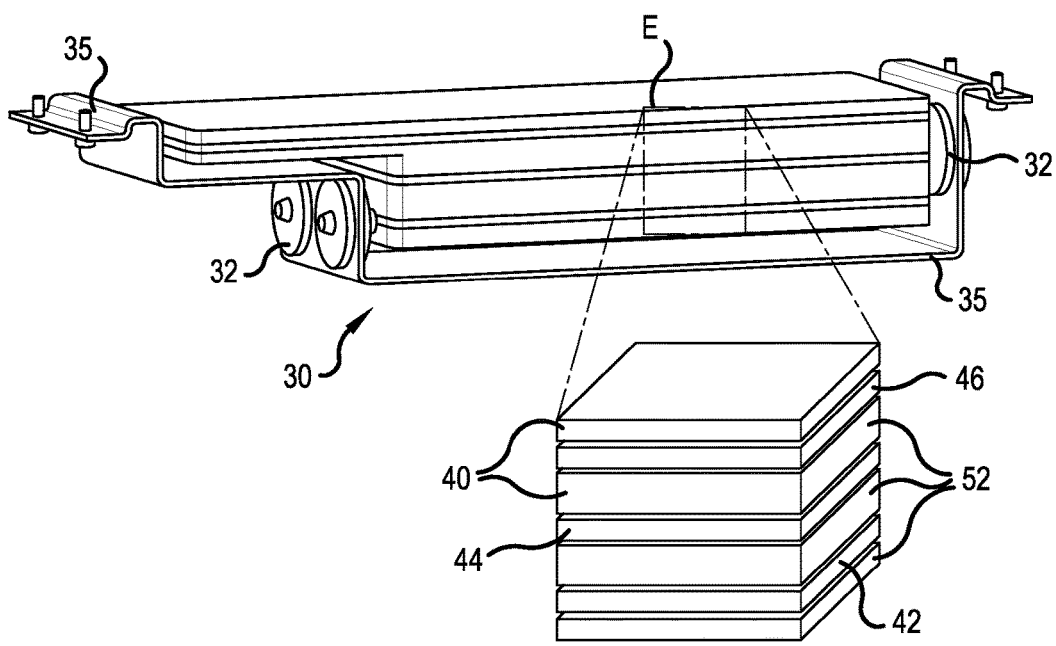
FIG. 4 is a perspective and enlarged view of an example of the reference clock unit of the embodiment of FIG. 3.
Figure 5:
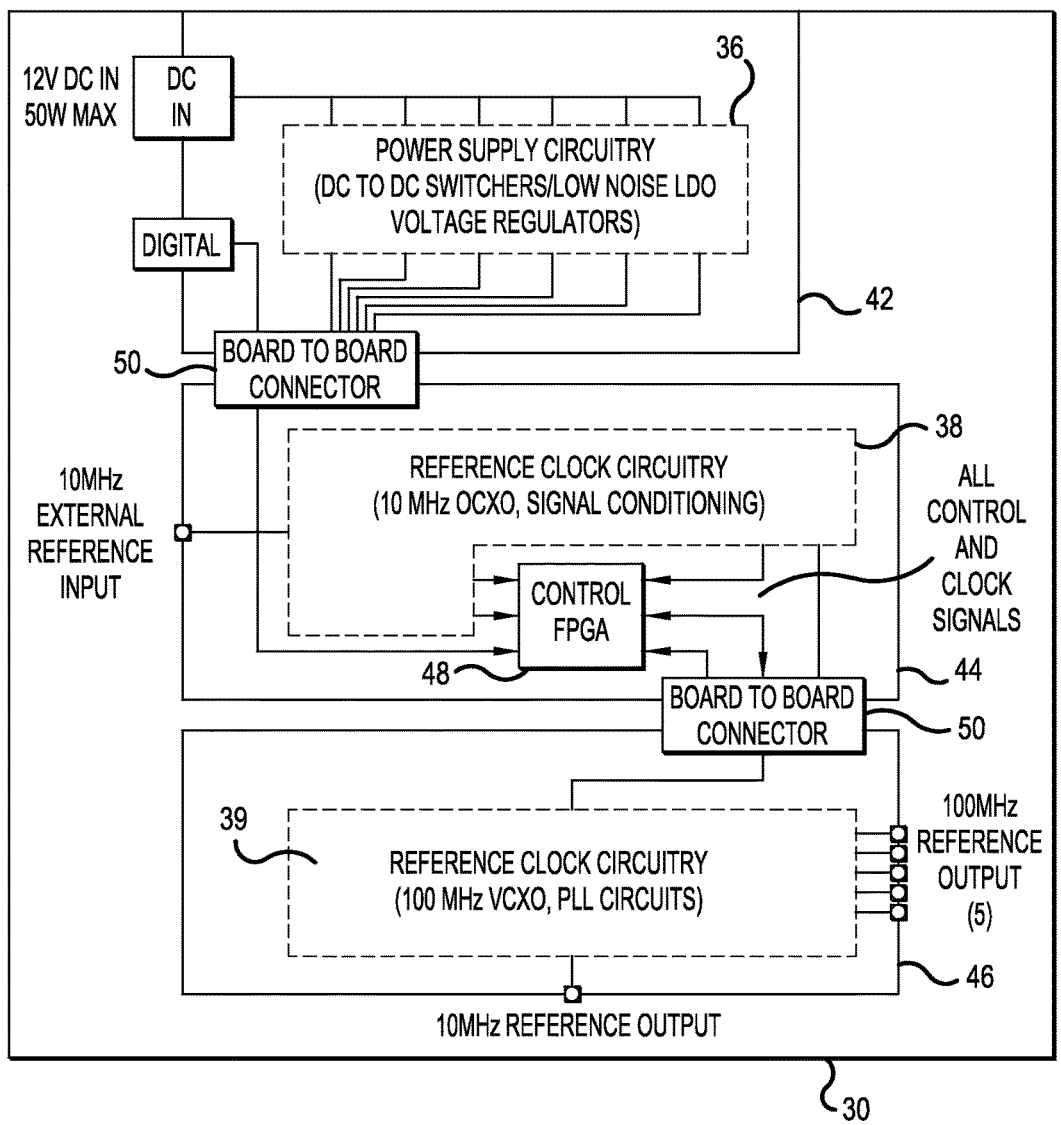
FIG. 5 is a schematic block diagram illustrating an example of the PCBs of the reference clock unit of the embodiment of FIGS. 3 and 4

With particular reference to FIGS. 4 and 5, power supply circuitry 36 and reference clock circuitry 38/39 are included in the reference clock unit 30. A shield 40 isolates the power supply circuitry 36 from the reference clock circuitry 38/39.

A plurality of reference clock outputs 41 are mounted in the front panel 22 and coupled to the reference clock circuitry 38/39. In an embodiment, the plurality of reference clock outputs 41 may be coaxial cable connectors, for example, as illustrated in the enlarged portion P of FIG. 1. Also, cables 43 may respectively connect the reference clock circuitry 38/39 to each of the reference clock outputs 41 (cable connectors).

In an embodiment, again referring in particular to FIGS. 4 and 5, the reference clock unit 30 may further include a plurality of printed circuit board (PCB) layers including at least a first PCB layer 42 having the power supply circuitry 36, and at least a second PCB layer 44 including the reference clock circuitry 38. As illustrated, a third PCB layer 46 is provided and includes additional reference clock circuitry 39.

As illustrated, for example, the reference clock, unit 30 is implemented in three separate PCBs. The power supply circuitry 36 of the first PCB layer 42 includes, for example, DC to DC switchers and low noise LDO (Low-DropOut) voltage regulators which provide the needed voltage rails for the reference clock circuitry 38. The reference clock circuitry 38 of the second PCB layer 44 includes, for example, a 10 MHz OCXO (Oven-Controlled Crystal Oscillator) reference clock which provides the high stability reference of the reference clock unit 30. It may also include signal conditioning circuitry for an external 10 MHz reference. An FPGA (Field Programmable Gate Array) 48 may be included in this PCB layer 44 for general control use. The third PCB layer 46 includes, for example, additional reference clock circuitry 39 including a 100 MHz VCXO (Voltage Controlled Crystal Oscillator) and PLL (Phase Locked Loop) circuitry which locks the 100 MHz to either the on-board 10 MHz OCXO reference, or an external reference. The reference clock circuitry 39 then drives this phase locked 100 MHz clock to the plurality of 100 MHz clock outputs 41 on the front panel 22, e.g. five outputs. The PCB layers 42, 44 and 46 may be coupled together via board-to-board connectors 50.

It should be noted that the illustrated embodiments are examples and the present approach is not limited to having the circuitry structured this way across the three PCBs (e.g. the PLL and OCXO could be on the second PCB, and VCXO and FPGA on the third PCB). There could be additional PCB layers or less PCB layers as desired in view of space constraints etc., i.e. depending on system requirements, more or less functionality could be implemented, thus requiring more or less PCB layers.

The shield 40 provides radiated noise immunity between the power supply circuitry 36 and the reference clock circuitry 38/39. As such, the shield 40 may include metal layers 52 between each of the PCB layers 42, 44, 46. The shield 40 may enclose each of the plurality of PCB layers 42, 44, 46. So, the noisy power supply circuitry 36 is implemented in a separate PCB layer 42 and may be fully enclosed in metal layers 52 (e.g. defining a metal housing) to provide noise isolation from the sensitive reference clock circuitry 38/39 on the PCB layers 44, 46.

As described herein, in various embodiments, the reference clock unit 30 includes its own power supply circuitry 36 and is therefore electrically isolated from the chassis power unit 24. Such separate power supply circuitry 36 provides electrical isolation from other noise sources within the chassis 10 and instrumentation modules 20, thus improving sensitivity to noise and increasing phase noise performance.

Figure 6:
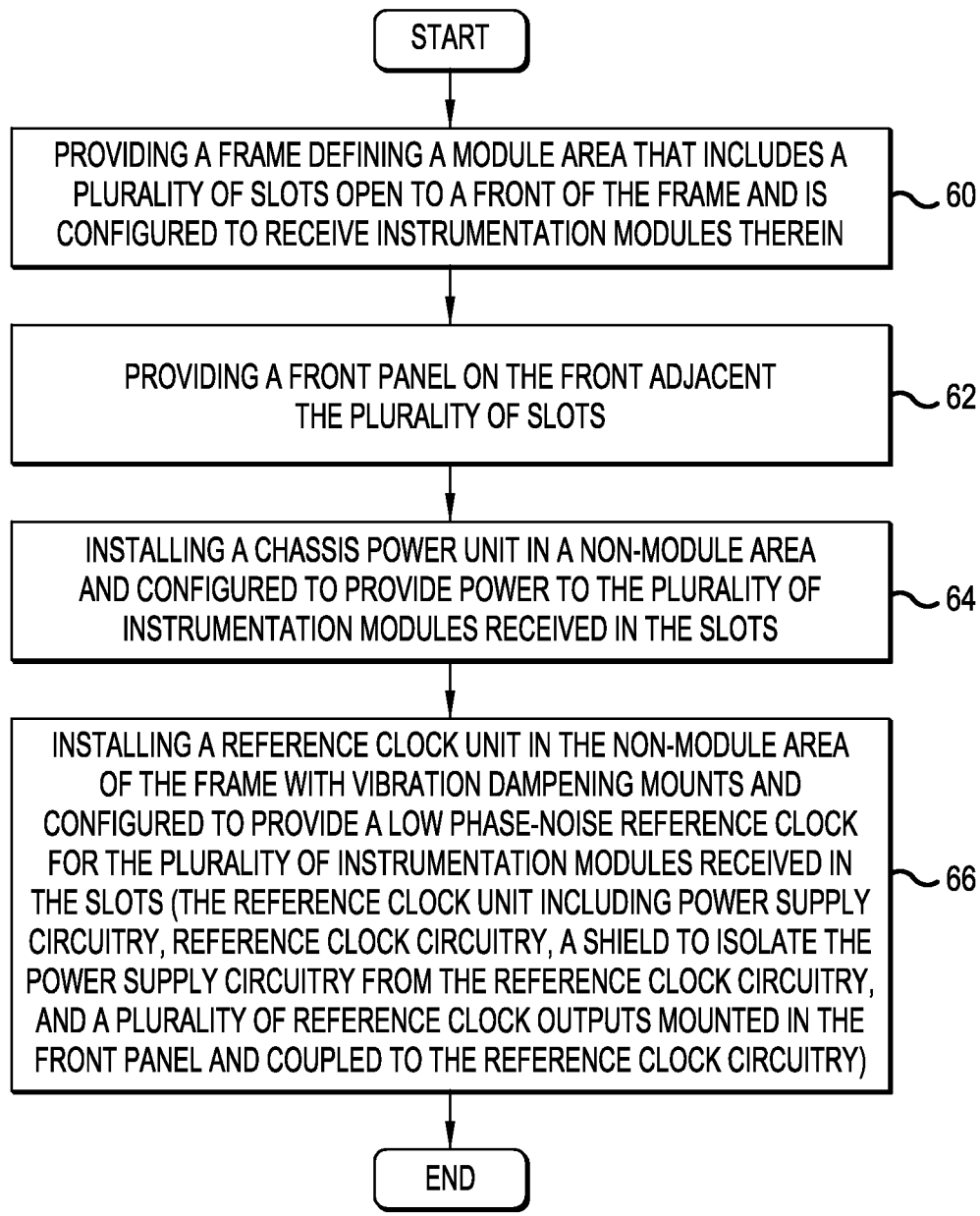
FIG. 6 is a flowchart illustrating a method of making a modular electronic instrumentation platform chassis with a dedicated reference clock unit according to a representative embodiment.

A method aspect of the present embodiments will be described with additional reference to the flowchart of FIG. 6. The method is for making a modular electronic instrumentation platform chassis 10 for use with a plurality of instrumentation modules 20. The method begins and includes providing (block 60) a frame 12 defining a module area 14 and a non-module area 16. The module area 14 includes a plurality of slots 18 open to a front of the frame 12 and is configured to receive instrumentation modules 20 therein. The method includes providing (block 62) a front panel 22 on the front of the frame 12 adjacent the plurality of slots 18, installing (block 64) a chassis power unit 24 configured to provide power to the plurality of instrumentation modules 20 received in the slots 18, and installing (block 66) a reference clock unit 30 in the non-module area 16 of the frame 12 with vibration dampening mounts 32 and configured to provide a low phase-noise reference clock for the plurality of instrumentation modules 20 received in the slots 18. As discussed in detail above, the reference clock unit 30 includes power supply circuitry 36, reference clock circuitry 38/39, a shield 40 to isolate the power supply circuitry 36 from the reference clock circuitry 38/39, and a plurality of reference clock outputs 41 mounted in the front panel 22 and coupled to the reference clock circuitry 38/39.

The method may include respectively connecting the reference clock circuitry 38/39 to cable connectors of the plurality of reference clock outputs 41 with cables 43. Also, the method may include electrically isolating the reference clock unit 30 from the chassis power unit 24.

The present embodiments integrate a high performance reference clock unit 30 into a modular electronic instrumentation platform chassis 10 (e.g. a PXIe chassis). The features of the present embodiments may provide advantages over existing approaches including: no longer being limited by form factor as the reference clock unit 30 can be as large as required, as long as it can fit within the chassis 10; not requiring a module slot 18 for the reference clock unit 30, thus freeing up valuable slot resources to be used for other instruments; providing vibration isolation to alleviate microphonic effects on the clocks due to vibration from fans and other external vibration sources; and the use of a separate power supply to provide electrical isolation from other noise sources within the chassis 10 and instrument modules 20, thus improving sensitivity to noise and increasing phase noise performance.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A modular electronic instrumentation platform chassis for use with a plurality of instrumentation modules and comprising:
   a frame defining a module area and a non-module area, the module area comprising a plurality of slots open to a front of the frame and configured to receive instrumentation modules therein;
   a front panel carried by the frame on the front of the frame adjacent the plurality of slots;
   a chassis power unit carried by the frame in the non-module area and configured to provide power to the plurality of instrumentation modules received in the slots; and
   a reference clock unit carried by the frame in the non-module area and configured to provide a low phase-noise reference clock for the plurality of instrumentation modules received in the slots, the reference clock unit comprising:
   vibration dampening mounts that mount the reference clock unit to the frame,
   a power supply circuitry enabling electrical isolation of the reference clock unit from the chassis power unit,
   a reference clock circuitry,
   a shield to isolate the power supply circuitry from the reference clock circuitry, and
   a plurality of reference clock outputs mounted in the front panel and coupled to the reference clock circuitry.

2. The modular electronic instrumentation platform chassis of claim 1, wherein the reference clock unit further comprises a plurality of printed circuit board (PCB) layers including at least a first PCB layer including the power supply circuitry, and at least a second PCB layer including the reference clock circuitry.

3. The modular electronic instrumentation platform chassis of claim 2, wherein the shield comprises a metal layer between the first and second PCB layers.

4. The modular electronic instrumentation platform chassis of claim 2, wherein the shield encloses each of the plurality of PCBs.

5. The modular electronic instrumentation platform chassis of claim 1, wherein the plurality of reference clock outputs comprises cable connectors.

6. The modular electronic instrumentation platform chassis of claim 5, further comprising cables respectively connecting the reference clock circuitry to each of the cable connectors of the plurality of reference clock outputs.

7. The modular electronic instrumentation platform chassis of claim 1, wherein the vibration dampening mounts comprise rubber mounts.

8. The modular electronic instrumentation platform chassis of claim 1, wherein the reference clock unit is electrically isolated from the chassis power unit.

9. A modular electronic instrumentation platform chassis for use with a plurality of instrumentation modules and comprising: a frame defining a module area and a non-module area, the module area comprising a plurality of slots and configured to receive instrumentation modules therein;
   a chassis power unit configured to provide power to the plurality of instrumentation modules received in the slots; and
   a reference clock unit carried by the frame in the non-module area, isolated from the chassis power unit, and configured to provide a reference clock for the plurality of instrumentation modules received in the slots, the reference dock unit comprising:
   vibration dampening mounts that mount the reference dock unit to the frame,
   a power supply circuitry enabling electrical isolation of the reference clock unit from the chassis power unit,
   a reference dock circuitry,
   a shield to isolate the power supply circuitry from the reference clock circuitry,
   and a plurality of reference dock outputs coupled to the reference clock circuitry.

10. The modular electronic instrumentation platform chassis of claim 9, wherein the reference clock unit further comprises a plurality of printed circuit board (PCB) layers including at least a first PCB layer including the power supply circuitry, and at least a second PCB layer including the reference clock circuitry.

11. The modular electronic instrumentation platform chassis of claim 10, wherein the shield comprises a metal layer between the first and second PCB layers.

12. The modular electronic instrumentation platform chassis of claim 10, wherein the shield encloses each of the plurality of PCBs.

13. The modular electronic instrumentation platform chassis of claim 9, wherein the plurality of reference clock outputs comprises cable connectors.

14. The modular electronic instrumentation platform chassis of claim 13, further comprising cables respectively connecting the reference clock circuitry to each of the cable connectors of the plurality of reference clock outputs.

15. The modular electronic instrumentation platform chassis of claim 9, wherein the vibration dampening mounts comprise rubber mounts.

* * * * *

UNITED STATES PATENT AND TRADEMARK OFFICE
CERTIFICATE OF CORRECTION

PATENT NO. : 9,723,727 B2  
APPLICATION NO. : 14/615143  
DATED : August 1, 2017  
INVENTOR(S) : Kuen Yew Lam et al.

It is certified that error appears in the above-identified patent and that said Letters Patent is hereby corrected as shown below:

In the Claims

In Column 8, Line 28, in Claim 9, after "area," insert -- electrically --.

In Column 8, Line 31, in Claim 9, delete "dock" and insert -- clock --, therefor.

In Column 8, Line 33, in Claim 9, delete "dock" and insert -- clock --, therefor.

In Column 8, Line 36, in Claim 9, delete "dock" and insert -- clock --, therefor.

In Column 8, Line 39, in Claim 9, delete "dock" and insert -- clock --, therefor.

Signed and Sealed this  
Third Day of October, 2017

Joseph Matal  
*Performing the Functions and Duties of the*  
*Under Secretary of Commerce for Intellectual Property and*  
*Director of the United States Patent and Trademark Office*